United States Patent
Lee et al.

(10) Patent No.: US 7,242,602 B2
(45) Date of Patent: Jul. 10, 2007

(54) SEMICONDUCTOR MEMORY DEVICES HAVING CONDUCTIVE LINE IN TWISTED AREAS OF TWISTED BIT LINE PAIRS

(75) Inventors: Chang-Ho Lee, Gyeonggi-do (KR); Jong-Hyun Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 209 days.

(21) Appl. No.: 11/002,034

(22) Filed: Dec. 2, 2004

(65) Prior Publication Data

US 2005/0135137 A1  Jun. 23, 2005

(30) Foreign Application Priority Data

Dec. 18, 2003 (KR) ............... 10-2003-0092837

(51) Int. Cl.
G11C 5/08 (2006.01)
G11C 5/06 (2006.01)
G11C 11/12 (2006.01)

(52) U.S. Cl. .................... 365/69; 365/63; 365/136; 365/191; 257/907

(58) Field of Classification Search .......... 365/63, 365/136, 191
See application file for complete search history.

(56) References Cited

U.S. PATENT DOCUMENTS

| | | | | |
|---|---|---|---|---|
| 4,977,542 A | * | 12/1990 | Matsuda et al. | 365/207 |
| 5,088,064 A | * | 2/1992 | Tsukude | 365/207 |
| 5,097,441 A | * | 3/1992 | Cho et al. | 365/51 |
| 5,534,732 A | * | 7/1996 | DeBrosse et al. | 257/776 |
| 5,867,440 A | | 2/1999 | Hidaka | |
| 6,069,815 A | * | 5/2000 | Mueller et al. | 365/63 |
| 6,140,704 A | * | 10/2000 | Kang et al. | 257/773 |
| 6,205,044 B1 | * | 3/2001 | Feurle et al. | 365/63 |
| 6,259,621 B1 | * | 7/2001 | Li et al. | 365/69 |
| 6,307,768 B1 | * | 10/2001 | Zimmermann | 365/51 |
| 6,385,115 B1 | | 5/2002 | Nakai | |
| 6,404,664 B1 | | 6/2002 | Numata | |
| 6,975,552 B2 | * | 12/2005 | Kim | 365/230.03 |
| 2002/0005590 A1 | * | 1/2002 | Keeth | 257/776 |
| 2004/0089913 A1 | * | 5/2004 | Yano et al. | 257/508 |
| 2004/0170075 A1 | * | 9/2004 | Suh | 365/205 |
| 2005/0045918 A1 | * | 3/2005 | Reith | 257/208 |

* cited by examiner

*Primary Examiner*—Amir Zarabian
*Assistant Examiner*—Ly Duy Pham
(74) *Attorney, Agent, or Firm*—Myers Bigel Sibley & Sajovec

(57) ABSTRACT

A semiconductor memory device includes spaced apart twisted bit line pairs, a respective one of which includes a spaced apart twisted area. A conductive line overlaps the respective twisted areas of the spaced apart twisted line pairs. The conductive line can extend parallel to the memory device word lines, and can provide a power supply ground and/or signal line.

22 Claims, 12 Drawing Sheets

SEMICONDUCTOR MEMORY DEVICES HAVING CONDUCTIVE LINE IN TWISTED AREAS OF TWISTED BIT LINE PAIRS

RELATED APPLICATION

This application claims the benefit under 35 U.S.C. §119 of Korean Patent Application No. 2003-0092837, filed Dec. 18, 2003, the disclosure of which is hereby incorporated herein by reference in its entirety as if set forth fully herein.

FIELD OF THE INVENTION

This invention relates to semiconductor (integrated circuit) memory devices, and more particularly to line layouts for arranging signal and/or power supply lines of semiconductor memory devices.

BACKGROUND OF THE INVENTION

Semiconductor (integrated circuit) memory devices are widely used in consumer and commercial applications. Typically, a semiconductor memory device such as a Dynamic Random Access Memory (DRAM) device employs a variety of operating voltages, including an external power supply voltage, ground voltage, internal power supply voltage, reference voltage and high voltage. Among these operating voltages, the internal power supply voltage is used to generate an array power supply voltage applied to a memory cell array.

The power supply lines may be arranged in a power-meshed pattern so as to enhance the efficiency of cell power supply in the memory cell array. The layout of the power supply lines or signal lines may become more significant with an increase in the size of the semiconductor memory device.

An example of the layout of power supply lines is disclosed in U.S. Pat. No. 5,867,440 to Hidaka. In Hidaka, power supply lines and grounding lines are arranged on the memory cell array so as to extend in the column direction. Another example of the layout of power supply lines is disclosed in U.S. Pat. No. 6,385,115 to Nakai, which discloses a power supply configuration in a meshed shape arrangement for a sense amplifier circuit.

The reduction of design rules may result in an increased parasitic capacitance of adjacent bit lines in the memory cell array of the semiconductor memory device. Namely, the adjacent bit lines form a parasitic capacitance caused by an insulation layer that is interposed between the adjacent bit lines, and the capacitance generally increases with a decrease in the thickness of the insulation layer. The parasitic capacitance may cause noise to make the data sensing operation of the sense amplifier unstable.

An approach to reducing the parasitic capacitance is a twisted bit line architecture. For example, a twisted bit line structure and a method for making the same is disclosed in U.S. Pat. No. 6,404,664 to Numata. A twisted bit line architecture can have a relatively low parasitic capacitance and less noise caused by the capacitive coupling among the bit line pairs during a sensing operation.

SUMMARY OF THE INVENTION

Semiconductor (integrated circuit) memory devices according to exemplary embodiments of the invention include a plurality of spaced apart twisted bit line pairs, a respective spaced apart twisted bit line pair including a respective twisted area. A conductive line also is provided that overlaps the respective twisted areas of the plurality of spaced apart twisted bit line pairs.

A plurality of spaced apart word lines also may be provided that intersect the plurality of spaced apart twisted line pairs. A plurality of memory cells also may be provided, a respective one of which is positioned at an intersection of a respective word line and a respective twisted bit line pair. In these embodiments, the conductive line may extend parallel to the plurality of spaced apart word lines. In other embodiments, the plurality of memory cells are arranged in a row direction and a column direction, the plurality of spaced apart twisted bit line pairs extend along the row direction and the plurality of spaced apart word lines and the conductive line extend along the column direction.

The conductive line can comprise a power supply, ground and/or signal line. The conductive line may also comprise a conductive line pair. In some embodiments, the plurality of spaced apart word lines and the conductive line extend in a single layer of the semiconductor memory device.

In other embodiments of the present invention, there is provided a line layout in a semiconductor memory device that includes at least one conductive line arranged in the same direction as the word lines in a twisted area of a plurality of twisted bit line pairs in the semiconductor memory device. The conductive line may comprise a power supply line or a signal line that is formed from metal, such as aluminum and/or copper. When the word lines are divided into a main word line and a sub-word line, the conductive line may be arranged in the same layer as the main word line. The power supply line may comprise an array power voltage supply line and/or an array grounding voltage supply line.

In other embodiments of the present invention, there is provided a layout in a semiconductor memory device that includes a memory cell array comprising a plurality of memory blocks each having a plurality of sub-array blocks comprising a plurality of memory cells arranged in rows and columns. A plurality of word lines are connected to the memory cells and arranged in a column direction of the memory cell array. A plurality of twisted bit line pairs are connected to the memory cells and arranged in a row direction. At least one power supply line is arranged in the column direction in the twisted areas of the plurality twisted bit line pairs.

In still other embodiments of the present invention, there is provided a layout in a semiconductor memory device that includes a memory cell array comprising a plurality of memory blocks, each having a plurality of sub-array blocks comprising a plurality of memory cells arranged in rows and columns. A plurality of sub-word lines are connected to the memory cells and arranged in a column direction of the memory cell array. A plurality of main word lines are connected to the corresponding sub-word lines and arranged in the column direction on the plurality of sub-word lines. A plurality of twisted bit line pairs are connected to the memory cells and arranged in a row direction of the memory cell array beneath a layer of the main word lines. At least one power supply line is arranged in the column direction in the same layer of the main word lines in the twisted areas of the plurality of twisted bit line pairs.

Some embodiments of the present invention may achieve reinforcement of power supply lines, layout efficiency of signal lines and/or optimization of line layout.

DETAILED DESCRIPTION

Figure 1:
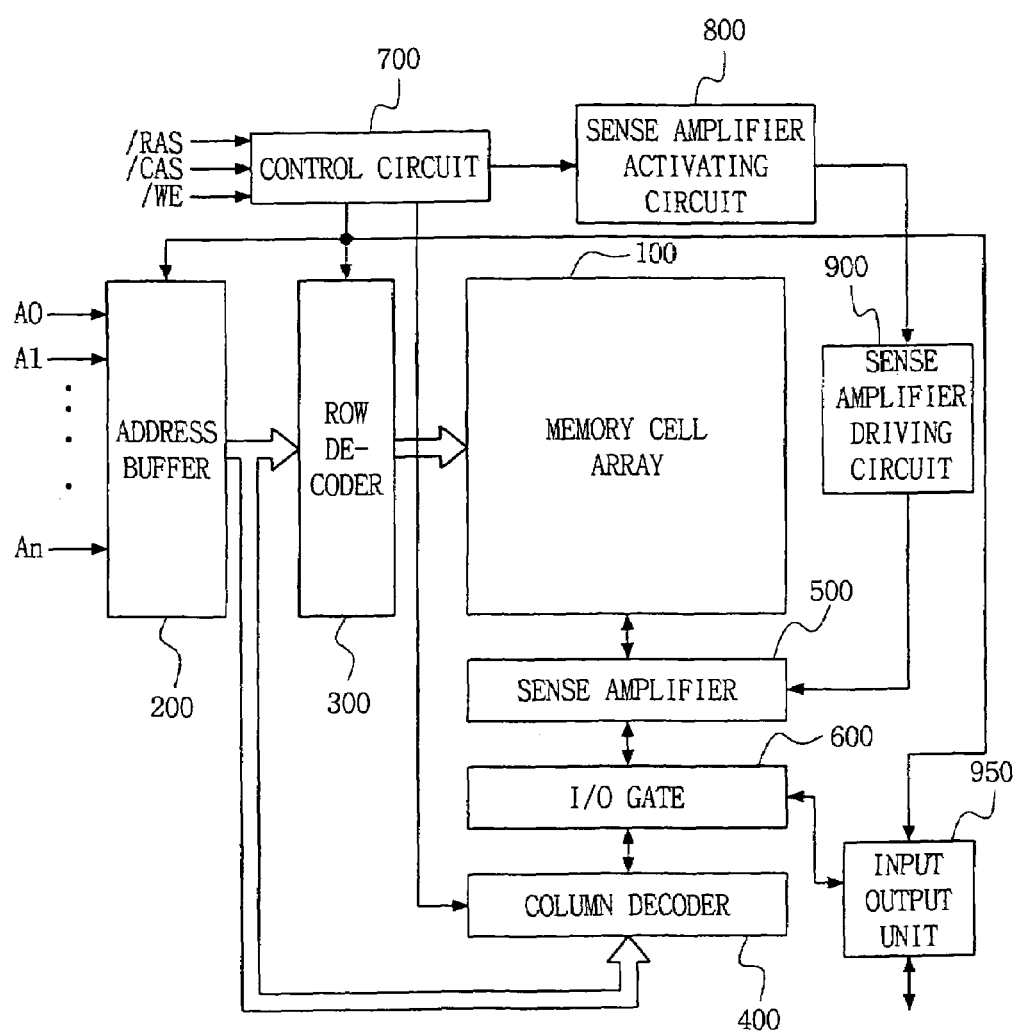
FIG. 1 is a block diagram of a conventional DRAM.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Thus, for example, the term "lower" is used to signify a layer that is closer to a substrate than an "upper" layer. Finally, the term "directly" means that there are no intervening elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first memory block could be termed a second memory block, and, similarly, a second memory block could be termed a first memory block without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It also will be understood that, as used herein, the terms "row" or "horizontal" and "column" or "vertical" indicate two relative non-parallel directions that may be orthogonal to one another. However, these terms do not require an absolute horizontal or vertical orientation as shown in the figures.

Embodiments of the present invention provide line layouts of signal lines and/or power supply lines in a twisted area of a plurality of twisted bit line pairs in a semiconductor memory device. Embodiments of the invention can provide reinforcement of power supply lines, enhanced arrangement efficiency of signal lines and/or optimization of line layout in a semiconductor memory device having a twisted bit line structure.

Hereinafter, a twisted bit line structure and a power line layout according to a conventional technique will be described by way of an example for more understanding of embodiments of the present invention that will be described later. The conventional technique will be described in connection with FIGS. 1 to 8.

FIG. 1 is a block diagram of a conventional DRAM. The block structure of FIG. 1 includes a memory cell array 100, an address buffer 200, a row decoder 300, a column decoder 400, an I/O gate 600, a sense amplifier 500, a control circuit 700, a sense amplifier activating circuit 800, a sense amplifier driving circuit 900, and an I/O section 950. The configuration of FIG. 1 is similar to FIG. 1 in U.S. Pat. No. 5,867,440, and need not be described further herein. Other conventional memory architectures also may be used.

Figure 2:
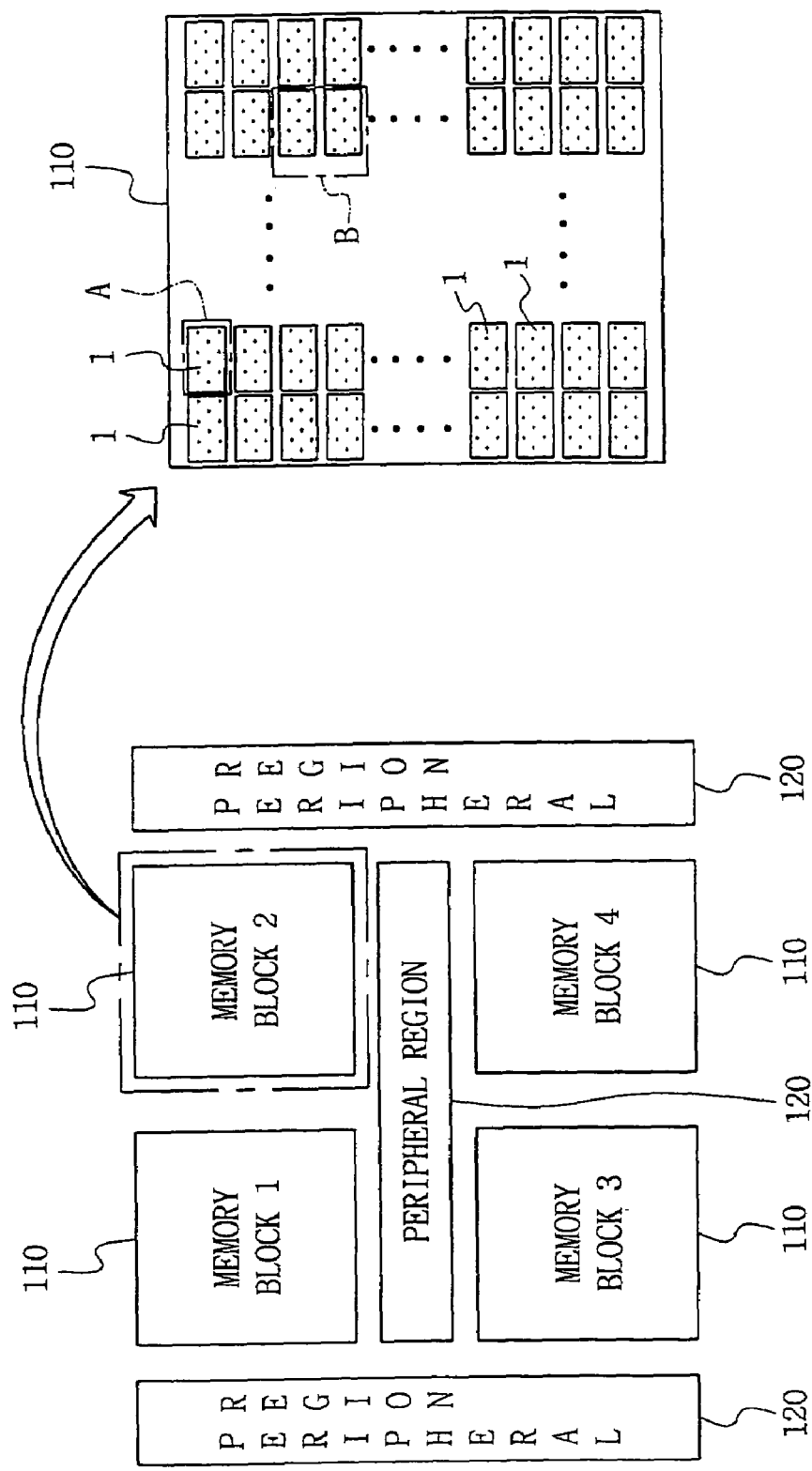
FIG. 2 is an illustration showing conventional sub-array blocks in a memory cell array of FIG. 1.

On the right side of FIG. 2 are shown sub-array blocks 1 in the memory cell array 100 of FIG. 1. As can be seen from FIG. 2, the memory cell array 100 of FIG. 1 comprises a plurality of memory blocks 110, each of which has a plurality of sub-array blocks 1. Each sub-array block 1 has a plurality of memory cells MCs arranged in rows and columns as shown in FIG. 3.

Figure 3:
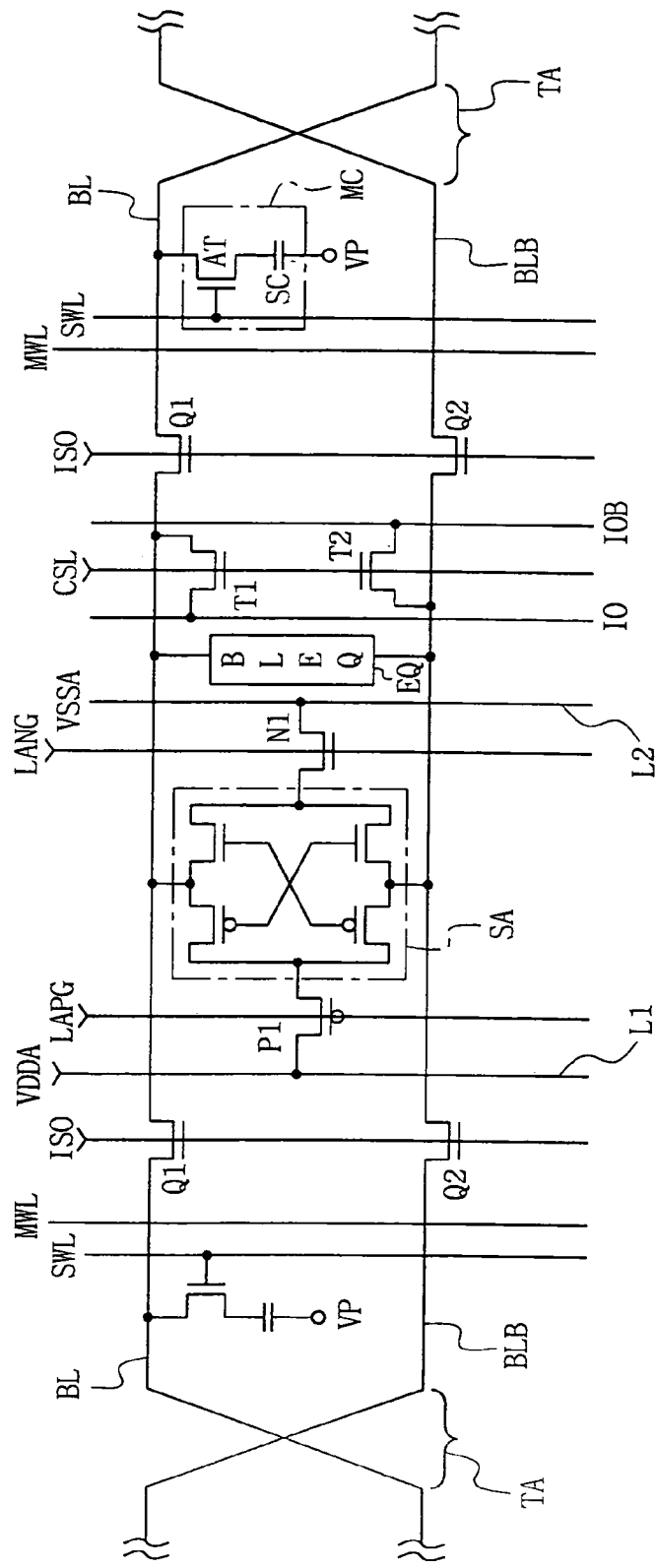
FIG. 3 is an exemplary circuit diagram showing a conventional power supply to memory cells in the sub-array blocks of FIG. 2 and twisted bit lines.

FIG. 3 is an exemplary illustration showing power supply to the memory cells MC in the sub-array blocks of FIG. 2 and twisted bit lines BL/BLB. Each memory cell MC comprises one access transistor AT and one storage capacitor SC. The access transistor AT has a gate terminal connected to a sub-word line SWL and a drain terminal connected to a bit line BL. The sub-word line SWL is connected to a main word line MWL.

In the figure, a variety of signal lines ISO, LAPG, LANG, CSI, IO, and IOB receive corresponding signals applied for a write operation to store data in the memory cells MCs and a read operation to read out the data from the memory cells MC at a predetermined timing. The data access operation that includes the write and read operations uses a cell power, which includes an array power voltage VDDA and an array grounding voltage VSSA. The array power voltage VDDA is applied to the source terminal of a p-type MOS transistor P1 for driving a p-type sense amplifier SA through a corresponding power supply line L1. The array grounding voltage VSSA is applied to the source terminal of an n-type MOS transistor N1 for driving an n-type sense amplifier SA through a corresponding power supply line L2. It should be noted that letter A is assigned to the array power voltage VDDA and the array grounding voltage VSSA, which are applied to the memory cell array apart from a power voltage VDDQ and a grounding voltage VSSQ applied to the I/O section 950 of FIG. 1.

The bit line pair, which refers to the bit line BL of FIG. 3 and complementary bit line BLB, has a twisted bit line structure because the bit lines intersect each other in the twisted areas TA in the figure.

Figure 4:
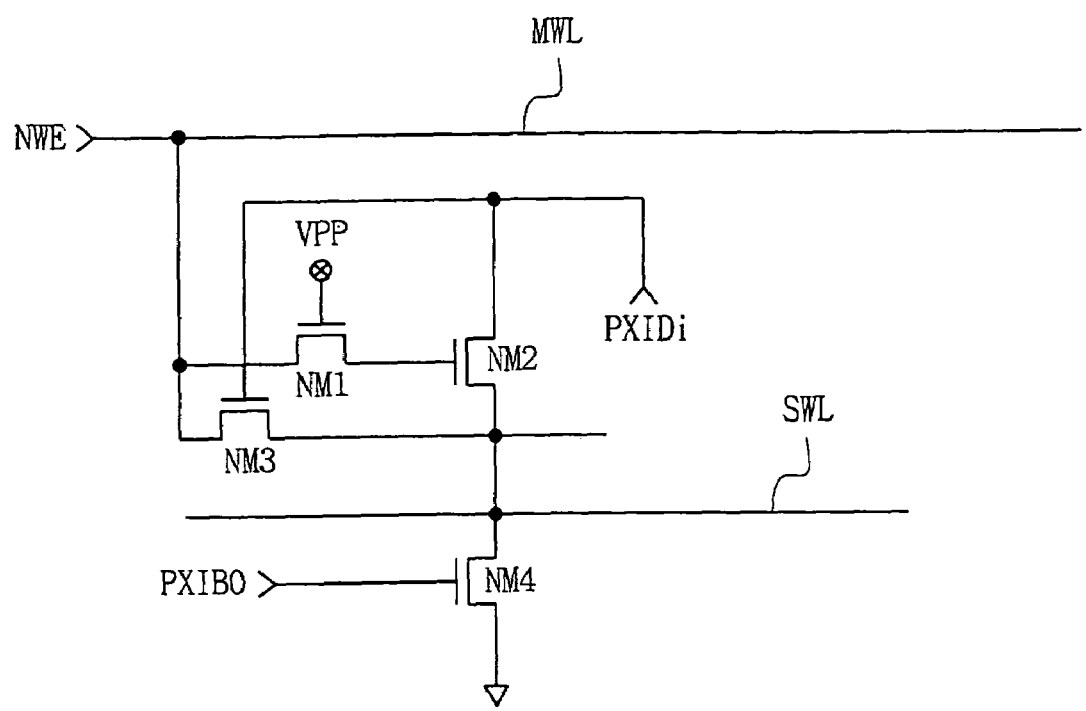
FIG. 4 is an exemplary circuit diagram of a conventional sub-word line driver showing the connection between the main word line and the sub-word line in FIG. 3.

FIG. 4 shows an exemplary circuit of a sub-word line driver SWD showing the connection between the main word line and the sub-word line in FIG. 3. Referring to the figure, the main word line MWL, which is a line activated by a normal word line enable signal NEW, is connected to the sub-word line SWL through a drain-source channel of an n-type MOS transistor NM3. One main word line MWL may be connected to at least four sub-word lines SWL. The operations of transistors NM1 to NM4 constituting the sub-word line driver SWD and decoding signals PXIB0 and PXIDi are widely known in the related art.

Figure 5:
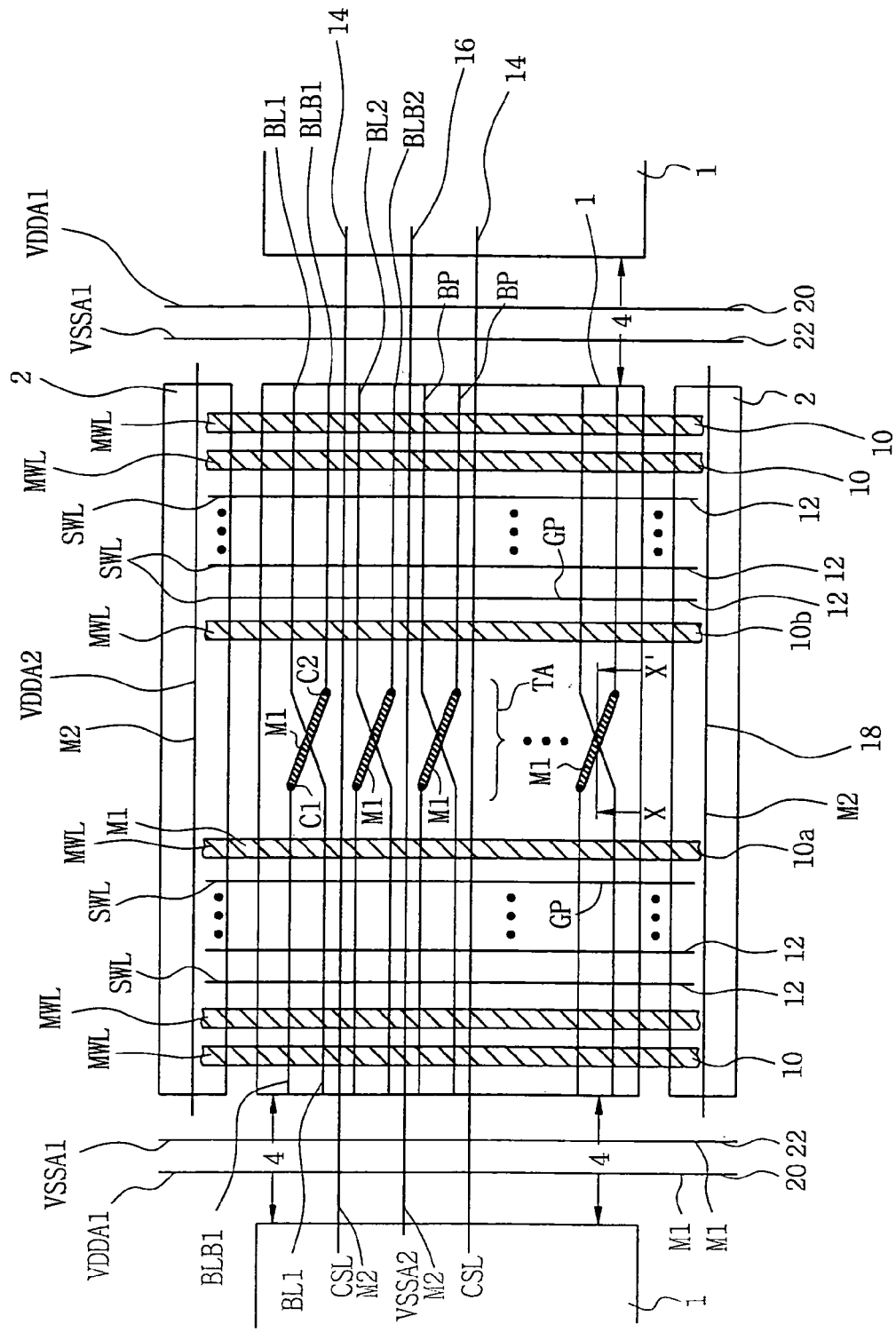
FIG. 5 is an illustration showing a conventional line layout of the sub-array block area A in FIG. 2.

FIG. 5 shows a conventional line layout of the sub-array block area A in FIG. 2. Referring to this figure, sub-array blocks 1 are vertically interposed between word line control areas 2 and horizontally between sensing areas 4. The sub-word line drivers SWD are arranged in the word line control area 2, and the sense amplifiers are arranged in the sensing area 4. Array power voltage supply lines VDDA1 for supplying an array power voltage VDDA, and array grounding voltage supply lines VSSA1 for supplying an array grounding voltage VSSA, are arranged in the column direction in the sensing area 4. Array power voltage supply lines VDDA2 for supplying the array power voltage VDDA are arranged in the row direction in the word line control area 2, and array grounding voltage supply lines VSSA2 for supplying the array grounding voltage VSSA are arranged in the row direction in the sub-array blocks 1. Here, the array power voltage supply lines VDDA1 and the array power voltage supply lines VDDA2 are arranged in different layers. Likewise, the array grounding voltage supply lines VSSA1 and the array grounding voltage supply lines VSSA2 are arranged in different layers.

The main word lines MWL comprising a first metal layer M1 and the sub-word lines SWL comprising a gate polysilicon layer GP are arranged in the column direction on the sub-array blocks 1. Column selection lines CSL comprising a second metal layer M2 are arranged in the row direction on the sub-array blocks 1.

The bit lines BL and the complementary bit lines BLB constituting bit line pairs are arranged in the row direction on the sub-array blocks 1. The bit line pairs comprising a bit line polysilicon layer BP are twisted by the first metal layer M1 in the twisted area TA. For example, the left-side complementary bit line BLB1 comprising a bit line polysilicon layer BP is connected to the right-side complementary bit line BLB1 through the first metal layer M1 connecting contact C1 to contact C2 in the twisted area TA. In this case, the bit line BL is formed from a bit line polysilicon layer BP to avoid electrical contact with the complementary bit line BLB1.

Figure 6:
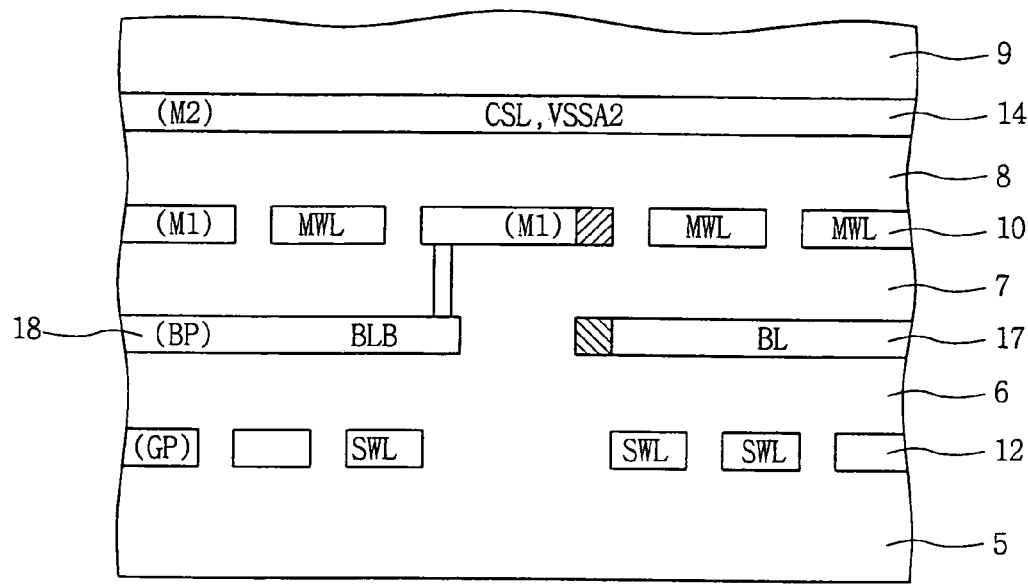
FIG. 6 is a schematic cross-section showing a conventional relationship of a part of the lines in FIG. 5.

The cross-section of FIG. 6 is taken along the line X-X of FIG. 5 to show the plane layout of FIG. 5. FIG. 6 is a cross-sectional diagram showing the hierarchical structure of part of the lines in FIG. 5. Referring to FIG. 6, the sub-word line SWL positioned on a substrate 5 comprises a gate polysilicon layer 12, the bit line pair of bit line BL and complementary bit line BLB positioned on an interlayer insulation layer 6 comprises bit line polysilicon layers 17 and 18, and the main word line MWL positioned on an insulation layer 7 comprises a first metal layer 10. The column selection line CSL and the array grounding voltage supply line VSSA2 positioned on an insulation layer 8 comprise a second metal layer 14. In the figure, the complementary bit line BLB is connected to the first metal layer M1 via a contact C1 so as to form a twisted bit line in the twisted area TA.

Finally, it will be understood that the first metal layer 10 is used to form the main word line MWL and the twisted bit line structure, in embodiments of FIG. 6.

Figure 7:
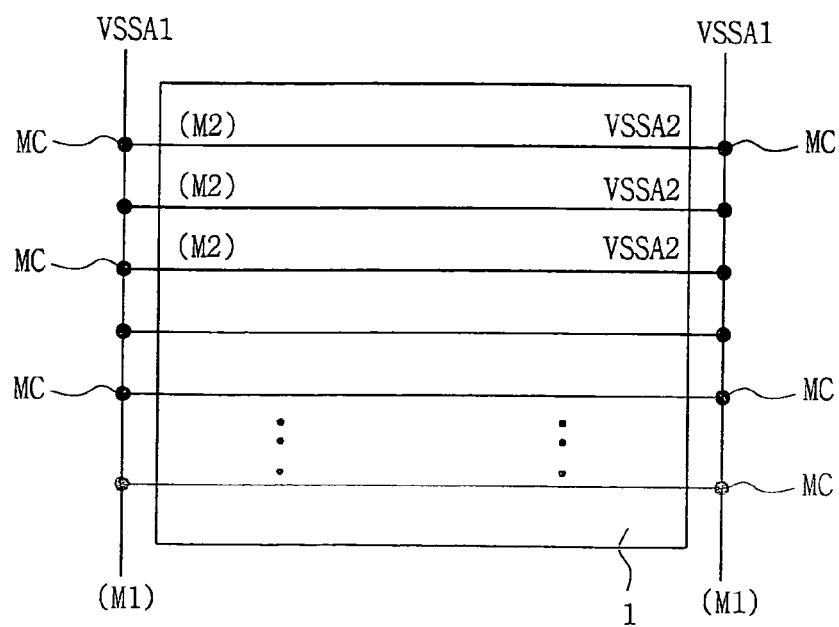
FIG. 7 is an illustration showing a conventional mesh structure of power supply lines according to FIG. 5.

The meshed structure of the array grounding voltage supply voltages VSSA1 and VSSA2 in the structure of FIG. 5 is separately shown as a wiring structure of FIG. 7. Referring to FIG. 7, which shows a meshed structure of the power supply lines according to FIG. 5, the array grounding voltage supply lines VSSA1 formed in the first metal layer M1 are connected to the array grounding voltage supply lines VSSA2 formed in the second metal layer M2 through a metal contact MC. The meshed structure of FIG. 7, which can be rectangular, does not have a metal contact on the sub-array blocks 1 due to the twisted structure of the twisted bit lines as shown in FIG. 6. Therefore, it may be difficult to optimally design the meshed structure.

Figure 8:
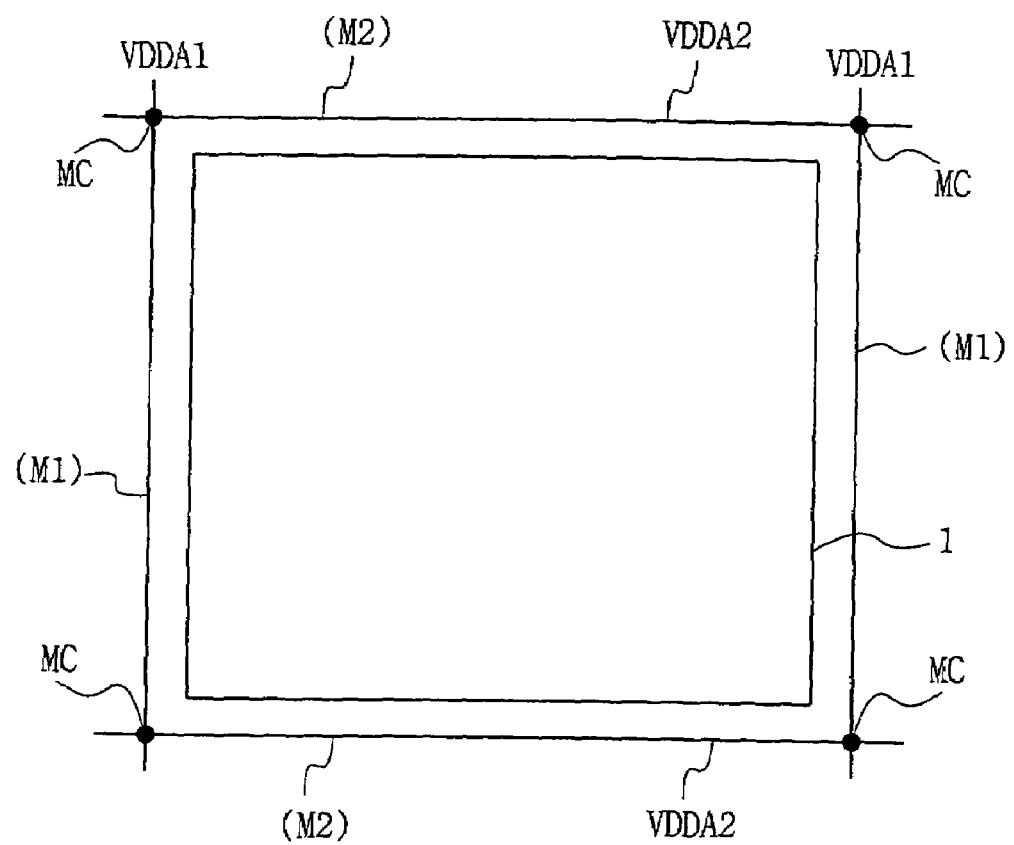
FIG. 8 is an illustration showing another conventional mesh structure of power supply lines according to FIG. 5.

Likewise, FIG. 8 shows another meshed structure of the power supply lines according to FIG. 5, more specifically, the meshed structure of the array power voltage supply lines VDDA1 and VDDA2. Also, since no metal contact is formed on the sub-array blocks 1 in this case, it may be difficult to optimally design the meshed structure.

Figure 9:
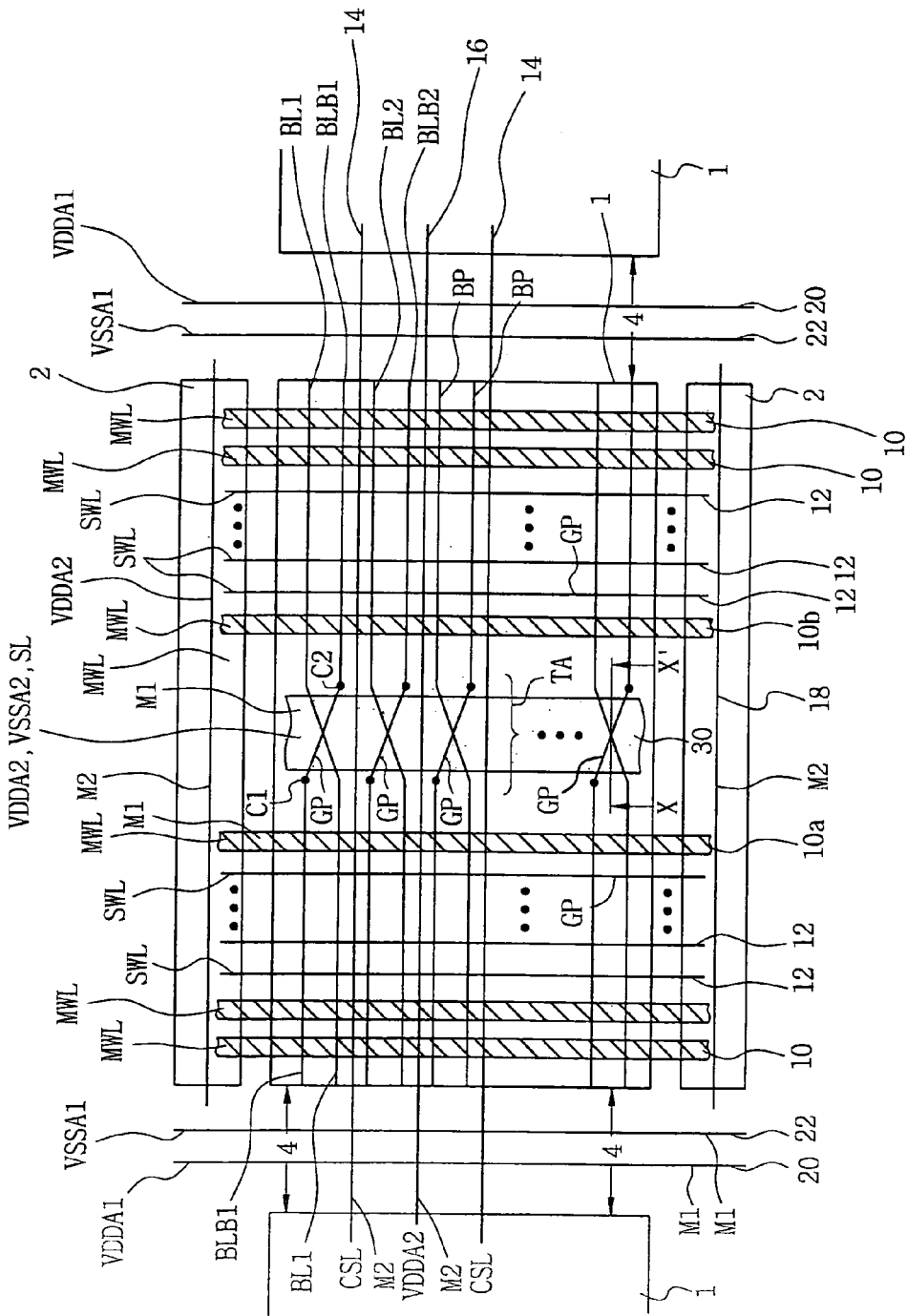
FIG. 9 is an illustration showing a line layout of a sub-array block area according to embodiments of the present invention.

In contrast, exemplary embodiments of the present invention can change the twisted bit line structure and can arrange signal lines and/or power supply lines in the twisted area as shown in FIG. 9.

FIG. 9 shows a line layout of the sub-array block area according to some embodiments of the present invention. Referring to the figure, a conductive line 30 used as a signal line and/or a power supply line is arranged in the same direction as the word lines, and disposed near twists of the bit lines. The line layout of FIG. 9 may be the same as that of FIG. 5, except for the conductive line 30 and the twisted bit line structure.

In FIG. 9, bit lines BL and complementary bit lines BLB that constitute bit line pairs are arranged in the row direction on the sub-array blocks 1. The bit line pairs comprising a bit line polysilicon layer BP are twisted by a gate polysilicon layer GP in the twisted area TA. For example, the left-side complementary bit line BLB1 comprising a bit line polysilicon layer BP is connected to the right-side complementary bit line BLB2 through a gate polysilicon layer GP connecting contact C1 to contact C2 in the twisted area TA. In this case, the bit line BL is formed from a bit line polysilicon layer BP to avoid electrical contact with the complementary bit line BLB1.

Accordingly, FIG. 9 also illustrates semiconductor memory devices according to embodiments of the present invention that include a plurality of spaced apart twisted bit line pairs BL/BLB, a respective spaced apart twisted pair including a respective twisted area TA. FIG. 9 also illustrates a conductive line 30 that overlaps the respective twisted areas TA of the plurality of spaced apart twisted bit line pairs. FIG. 9 also illustrates a plurality of spaced apart word lines MWL/SWL that intersect the plurality of spaced apart twisted bit line pairs BL/BLB, wherein the conductive line 30 extends parallel to the plurality of spaced apart word lines MWL/SWL.

Figure 10:
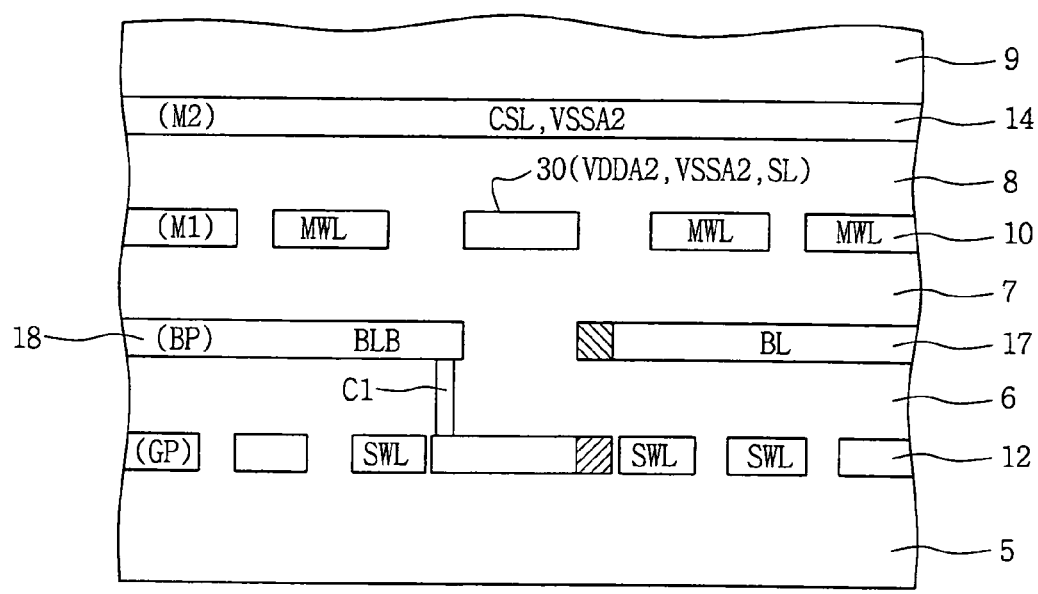
FIG. 10 is a schematic cross-section showing a relationship of a part of the lines in FIG. 9 according to embodiments of the present invention.

The cross-section of FIG. 10 is taken along the line X-X of FIG. 5 to show the plane layout of FIG. 9. FIG. 10 is a cross-sectional diagram showing the structure of part of lines in FIG. 9.

Referring to FIG. 10, a sub-word line SWL positioned on a substrate 5 comprises a gate polysilicon layer 12. A bit line pair of bit line BL and complementary bit line BLB positioned on an interlayer insulation layer 6 comprises bit line polysilicon layers 17 and 18. A main word line MWL positioned on an insulation layer 7 comprises a first metal layer 10. A column selection line CSL and an array grounding voltage supply line VSSA2 on an insulation layer 8 comprise a second metal layer 14. In the figure, the complementary bit line BLB is connected to the gate polysilicon layer GP via contact C1 so as to form a twisted bit line in the twisted area TA.

Finally, it will be understood that the first metal layer 10 in the twisted area TA is used to form the conductive line 30, in embodiments of FIG. 10.

Figure 11:
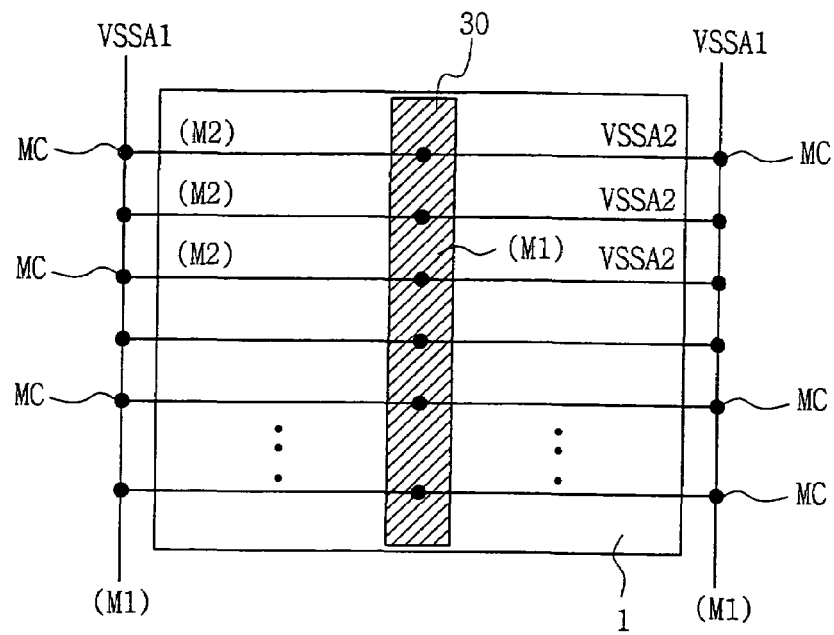
FIGS. 11 and 12 are illustrations showing a mesh structure of power supply lines of FIG. 9 according to embodiments of the present invention.

The meshed structure of the array grounding voltage supply voltages VSSA1 and VSSA2 in the structure of FIG. 9 can be separately shown as a wiring structure of FIG. 11. FIG. 11 shows a meshed structure of the power supply lines according to embodiments of FIG. 9. The array grounding voltage supply lines VSSA1 formed in the first metal layer M1 are connected to the array grounding voltage supply lines VSSA2 formed in the second metal layer M2 through a metal contact MC. On the sub-array blocks 1, the array grounding voltage supply lines VSSA2 have a metal contact with the conductive line 30, thereby reinforcing the rectangular meshed structure of FIG. 7. Namely, the use of the conductive line 30 as the array grounding voltage supply lines VSSA1 may reduce power noise for the array grounding voltage VSSA.

Figure 12:
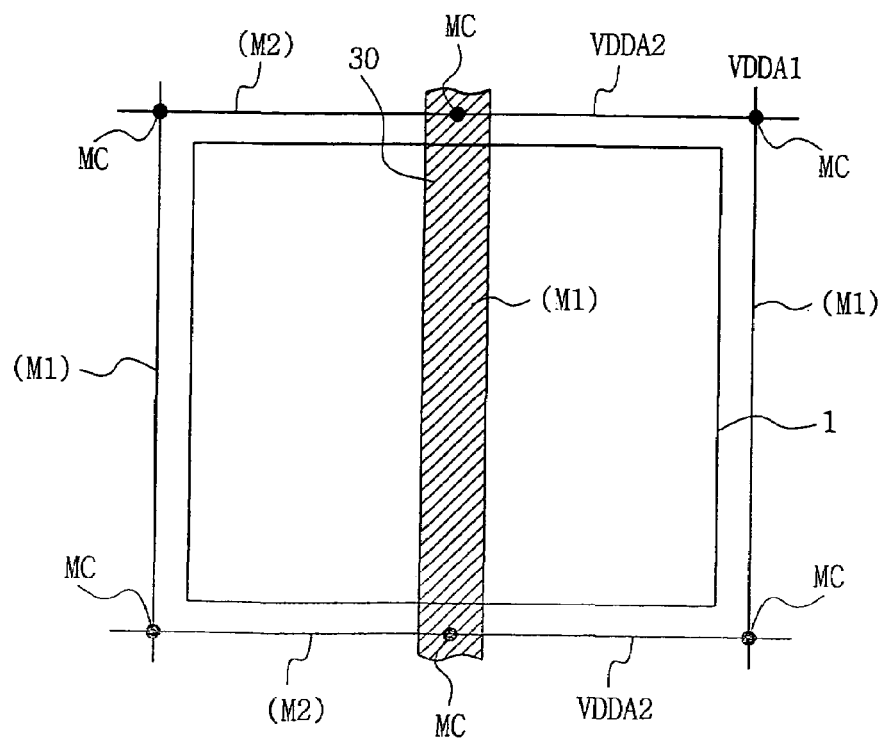

Likewise, FIG. 12 shows another meshed structure of the power supply lines according to FIG. 9, more specifically, the meshed structure of the array power voltage supply lines VDDA1 and VDDA2. A metal contact with the conductive line 30 is also formed on the sub-array blocks 1 in this case. Namely, the use of the conductive line 30 as the array grounding voltage supply lines VSSA1 may reduce power noise for the array grounding voltage VSSA.

Figure 13:
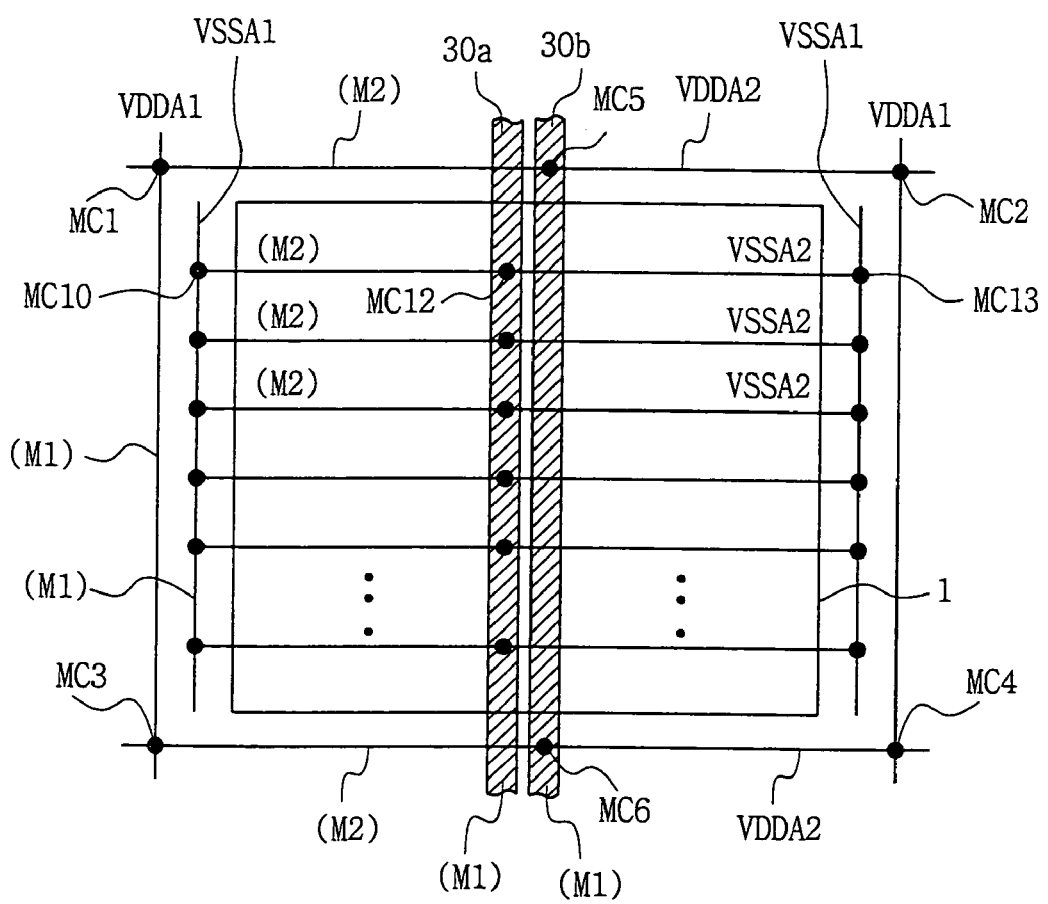
FIG. 13 is an exemplary illustration of another structure of power supply lines of FIG. 9 according to embodiments of the present invention.

FIG. 13 is an illustration of another exemplary meshed structure of the power supply lines according to FIG. 9, showing that the conductive line 30 comprising the first metal layer M1 may be divided into two lines, the one of which is used as an array power voltage supply line and the other is used as an array grounding voltage supply line. Referring to the figure, the arrangement of the conductive line 30 and the connection through a contact can reinforce the meshed structure of array power voltage supply lines VDDA1 and VDDA2 and that of array grounding voltage supply lines VSSA1 and VSSA2. Accordingly, FIG. 13 illustrates that the spaced apart conductive line comprises a conductive line pair, in some embodiments of the present invention.

Figure 14:
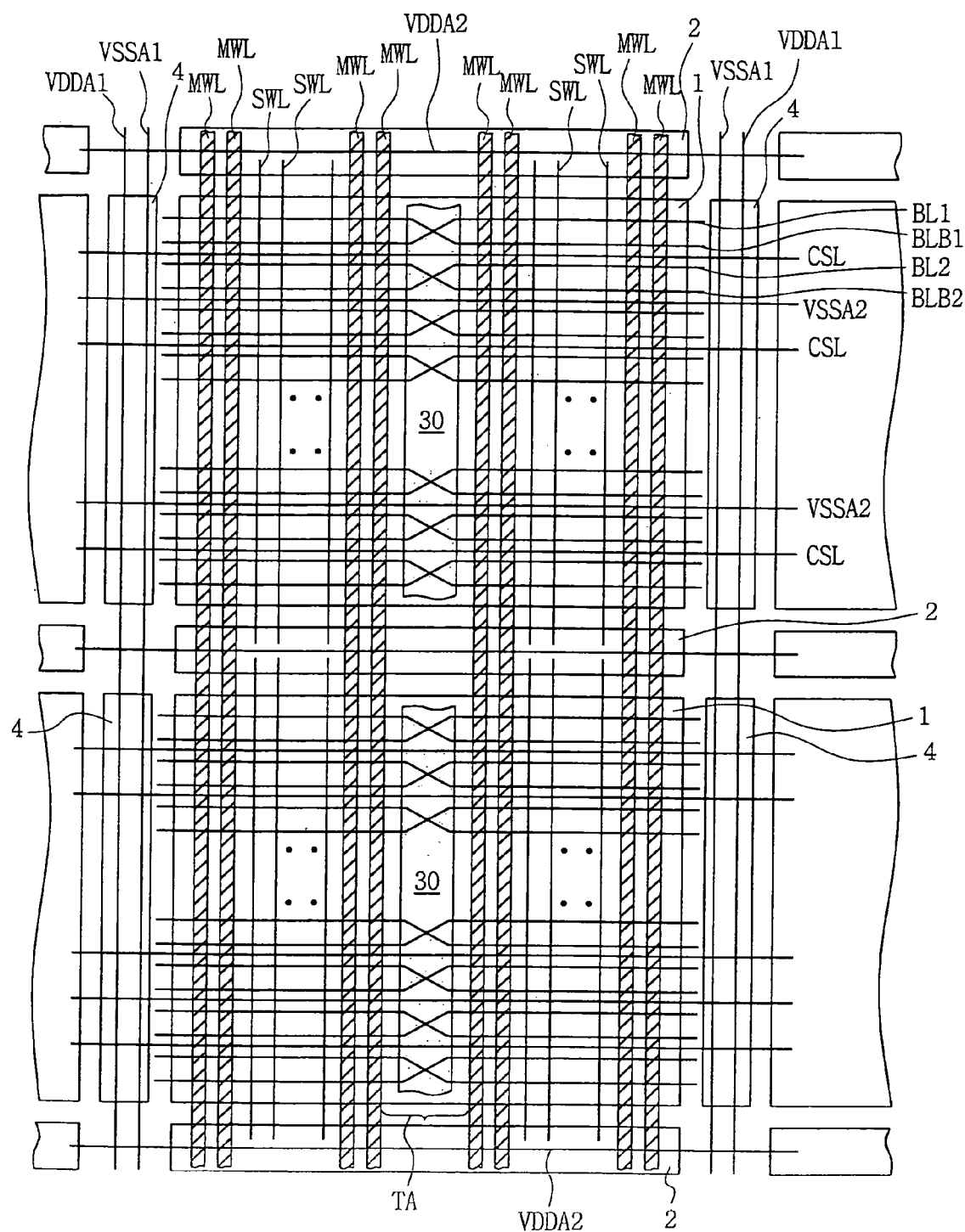
FIG. 14 is a layout showing the layout of FIG. 9 expanded in two sub-array block areas according to embodiments of the present invention.

FIG. 14 shows a layout of FIG. 9 expanded in two sub-array block areas. A conductive line 30 comprising a first metal layer M1 is formed along the twisted area TA. The conductive line 30, which is used as a signal line or a power supply line, is arranged in the same direction of the main word line or the sub-word line along the twisted area TA. The bit line BL and the complementary bit line BLB constituting a bit line pair are arranged in the row direction on the sub-array blocks 1. The bit line pair comprising a bit line polysilicon layer BP is twisted by a gate polysilicon layer GP in the twisted area TA.

Array power voltage supply lines VDDA1 for supplying array power voltage VDDA and array grounding voltage supply lines VSSA1 for supplying array grounding voltage VSSA are arranged in the column direction in the sensing area 4. Array power voltage supply lines VDDA2 for supplying array power voltage VDDA and array grounding voltage supply lines VSSA2 for supplying array grounding voltage VSSA are arranged in the row direction in the sub-array blocks 1. Here, the array power voltage supply lines VDDA1 and the array power voltage supply lines VDDA2 are arranged on different layers. Likewise, the array grounding voltage supply lines VSSA1 and the array grounding voltage supply lines VSSA2 are arranged on different layers.

The main word lines MWL comprising a first metal layer M1 and the sub-word lines SWL comprising a gate polysilicon layer GP are arranged in the column direction on the sub-array blocks 1. Column selection lines CSL comprising a second metal layer M2 are arranged in the row direction on the sub-array blocks 1.

The bit lines BL and the complementary bit lines BLB constituting bit line pairs are arranged in the row direction on the sub-array blocks 1. The bit line pairs comprising a bit line polysilicon layer BP are twisted by a bit line polysilicon layer BP in the twisted area TA.

Finally, cell array power supply lines VDDA and VSSA, or signal lines are additionally arranged by forming the conductive line 30 in the word line direction in the bit line twisted area, which can reduce power noise of the cell array, achieve layout efficiency of signal lines, optimize the line layout, and/or reduce effects of a defective power supply.

It will be understood that the number and the pattern of lines arranged in the twisted area of a plurality of twisted bit line pairs in the semiconductor memory device can be varied in various modifications within the spirit of the appended claims, or other signal lines and/or circuit element forming sections can be provided in the twisted area.

As described above, embodiments of the present invention can arrange signal lines and/or power supply lines in the twisted area of a plurality of twisted bit line pairs in a semiconductor memory device and can achieve reinforcement of power supply lines, layout efficiency of signal lines and/or optimization of line layout.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A line layout in a semiconductor memory device that includes a plurality of spaced apart word lines and a plurality of spaced apart twisted line pairs that include twisted areas, the line layout comprising:
    at least one conductive line arranged in the same direction as the word lines in a twisted area of a plurality of twisted bit line pairs in the semiconductor memory device, wherein the at least one conductive line comprises a power supply line.

2. The line layout in the semiconductor memory device as claimed in claim 1, wherein the at least one conductive line comprises metal.

3. The line layout in the semiconductor memory device as claimed in claim 2, wherein the word lines are divided into a main word line and a sub-word line, and wherein the at least one conductive line is arranged in the same layer as the main word line.

4. The line layout in the semiconductor memory device as claimed in claim 1, wherein the power supply line includes an array power voltage supply line or an array grounding voltage supply line.

5. The line layout in the semiconductor memory device as claimed in claim 1, wherein the power supply line includes an array grounding voltage supply line.

6. A semiconductor memory device, comprising:
    a memory cell array comprising a plurality of memory blocks each having a plurality of sub-array blocks comprising a plurality of memory cells arranged in rows and columns;
    a plurality of word lines connected to the memory cells and arranged in a column direction of the memory cell array;
    a plurality of twisted bit line pairs connected to the memory cells and arranged in a row direction of the memory cell array, the twisted bit line pairs including a twisted area; and
    at least one power supply line arranged in the column direction in the twisted areas of the plurality of twisted bit line pairs.

7. The semiconductor memory device as claimed in claim 6, wherein the power supply line comprises metal.

8. The semiconductor memory device as claimed in claim 6, wherein the word lines are divided into a main word line and a sub-word line, and wherein the power supply line is arranged in the same layer as the main word line.

9. The semiconductor memory device as claimed in claim 6, wherein the power supply line includes an array power voltage supply line or an array grounding voltage supply line.

10. A semiconductor memory device, comprising:
    a memory cell array comprising a plurality of memory blocks each having a plurality of sub-array blocks comprising a plurality of memory cells arranged in rows and columns;
    a plurality of sub-word lines connected to the memory cells and arranged in a column direction of the memory cell array;
    a plurality of main word lines connected to the corresponding sub-word lines and arranged in the column direction on the plurality of sub-word lines;
    a plurality of twisted bit line pairs connected to the memory cells and arranged in a row direction of the memory cell array beneath a layer of the main word lines, the twisted line pairs including a twisted area; and
    at least one power supply line arranged in the column direction in the layer of the main word lines in the twisted areas of the plurality of twisted bit line pairs.

11. The semiconductor memory device as claimed in claim 10, wherein the power supply line comprises metal.

12. The semiconductor memory device as claimed in claim 10, wherein the power supply line includes an array power voltage supply line or an array grounding voltage supply line.

13. A line layout method in a semiconductor memory device that includes a plurality of spaced apart word lines and a plurality of spaced apart twisted line pairs that include twisted areas, the line layout method comprising:
    forming at least one conductive power supply line in parallel with main word lines in the same layer as the main word lines in a twisted area of a plurality of twisted bit line pairs in the semiconductor memory device.

14. A semiconductor memory device comprising:
    a plurality of spaced apart twisted bit line pairs, a respective spaced apart twisted bit line pair including a respective twisted area; and
    a conductive line that overlaps the respective twisted areas of the plurality of spaced apart twisted bit line pairs, wherein the conductive line comprises a power supply line.

15. The semiconductor memory device as claimed in claim 14 further comprising:
    a plurality of spaced apart word lines that cross the plurality of spaced apart twisted bit line pairs; and
    a plurality of memory cells, a respective one of which is positioned at an intersection of a respective word line and a respective twisted bit line pair;
    wherein the conductive line extends parallel to the plurality of spaced apart word lines.

16. The semiconductor memory device as claimed in claim 15 wherein the plurality of memory cells are arranged in a row direction and a column direction, wherein the plurality of spaced apart twisted bit line pairs extend along the row direction and wherein the plurality of spaced apart word lines and the conductive line extends along the column direction.

17. The semiconductor memory device as claimed in claim 14 wherein the conductive line comprises a pair of conductors.

18. The semiconductor memory device as claimed in claim 15 wherein the plurality of spaced apart word lines and the conductive line extend in a single layer of the semiconductor memory device.

19. The line layout in a semiconductor memory device as claimed in claim 1, further comprising at least another power supply line located in a sensing area and oriented in the same direction as the word lines in the twisted areas.

20. The semiconductor memory device as claimed in claim 6, further comprising at least another power supply line arranged in the column direction in a sensing area.

21. The semiconductor memory device as claimed in claim 10, further comprising at least another power supply line arranged in the column direction in a sensing area.

22. The semiconductor memory device as claimed in claim 14, further comprising a power supply line in a sensing area.

* * * * *